US008685811B2

(12) United States Patent  
Lin et al.

(10) Patent No.: US 8,685,811 B2
(45) Date of Patent: Apr. 1, 2014

(54) METHOD FOR MANUFACTURING A CMOS DEVICE HAVING DUAL METAL GATE

(75) Inventors: Chien-Ting Lin, Hsin-Chu (TW); Li-Wei Cheng, Hsin-Chu (TW); Che-Hua Hsu, Hsin-Chu Hsien (TW); Guang-Hwa Ma, Hsinchu (TW); Chin-Sheng Yang, Hsin-Chu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 974 days.

(21) Appl. No.: 12/013,485

(22) Filed: Jan. 14, 2008

(65) Prior Publication Data

US 2009/0181504 A1   Jul. 16, 2009

(51) Int. Cl.
*H01L 21/8238* (2006.01)

(52) U.S. Cl.
USPC .................. 438/199; 438/275; 257/E21.635; 257/E21.637

(58) Field of Classification Search
USPC .......... 438/275, 199, 652, 592; 257/E21.635, 257/E21.637
See application file for complete search history.

(56) References Cited

U.S. PATENT DOCUMENTS

| 6,303,418 | B1 * | 10/2001 | Cha et al. .................... 438/199 |
| 6,406,956 | B1 * | 6/2002 | Tsai et al. .................... 438/201 |
| 6,696,333 | B1 | 2/2004 | Zheng |
| 6,727,129 | B1 * | 4/2004 | Nakajima .................... 438/197 |
| 7,078,282 | B2 | 7/2006 | Chau et al. |
| 7,098,516 | B2 | 8/2006 | Colombo et al. |
| 7,157,278 | B2 | 1/2007 | Jin |
| 7,208,361 | B2 | 4/2007 | Shah et al. |
| 7,229,873 | B2 * | 6/2007 | Colombo et al. ............. 438/231 |
| 2004/0026734 | A1 | 2/2004 | Clevenger |
| 2006/0051915 | A1 * | 3/2006 | Kadoshima et al. ......... 438/216 |
| 2007/0037343 | A1 | 2/2007 | Colombo |
| 2007/0296002 | A1 | 12/2007 | Liang |
| 2008/0173947 | A1 * | 7/2008 | Hou et al. .................... 257/369 |

FOREIGN PATENT DOCUMENTS

TW       200739907       10/2007

* cited by examiner

*Primary Examiner* — David Vu
(74) *Attorney, Agent, or Firm* — Winston Hsu; Scott Margo

(57) ABSTRACT

A method for manufacturing a CMOS device includes providing a substrate having a first active region and a second active region defined thereon, forming a first conductive type transistor and a second conductive type transistor respectively in the first and the second active regions, performing a salicide process, forming an ILD layer, performing a first etching process to remove a first gate of the first conductive type transistor and to form an opening while a high-K gate dielectric layer is exposed in a bottom of the opening, and forming at least a first metal layer in the opening.

12 Claims, 13 Drawing Sheets

METHOD FOR MANUFACTURING A CMOS DEVICE HAVING DUAL METAL GATE

BACKGROUND OF THE INVENTION

1. Field of the Invention

The invention relates to a method for manufacturing a complementary metal-oxide semiconductor (CMOS) device having a dual metal gate, and more particularly, to a method for manufacturing a CMOS device with a gate last process.

2. Description of the Prior Art

With a trend towards scaling town the CMOS size, conventional methods, which are used to achieve optimization, such as reducing thickness of the gate dielectric layer, for example the thickness of silicon dioxide layer, have faced problems such as leakage current due to tunneling effect. In order to keep progression to next generation, high-K materials are used to replace the conventional silicon oxide to be the gate dielectric layer because it decreases physical limit thickness effectively, reduces leakage current, and obtains equivalent capacitor in an identical equivalent oxide thickness (EOT).

On the other hand, the conventional polysilicon gate also has faced problems such as inferior performance due to boron penetration and unavoidable depletion effect which increases equivalent thickness of the gate dielectric layer, reduces gate capacitance, and worsens a driving force of the devices. Thus double work function metals are developed to replace the conventional polysilicon gate to be the control electrode that competent to the high-K gate dielectric layer.

One of the double work function metal gates is used in an NMOS device and the other one is alternatively used in a PMOS device. It is well-known that compatibility and process control for the dual metal gate are more complicated, meanwhile thickness and composition controls for materials used in the dual metal gate method have to be more precise. For instance, in a conventional dual metal gate method applied with the gate first process, the anneal process for forming the source/drain ultra-shallow junction, and the silicide process are performed after forming the metal gate. After the anneal process having such strict heat budget, it is found that a flat band voltage ($V_{fb}$) does not increase or decrease linearly with decrease of EOT of the high-K gate dielectric layer. Please refer to FIG. 1, which is a diagram illustrating the relationship of EOT of the high-K gate dielectric layer of a PMOS device vs. $V_{fb}$. As shown in FIG. 1, an expected linear relationship between the $V_{fb}$ of the PMOS device and EOT is not observed, instead the $V_{fb}$ drops abruptly while the EOT decreases steadily. The $V_{fb}$ roll-off issue is more obvious in the PMOS device.

Therefore a method that is able to effectively improve the $V_{fb}$ roll-off issue without increasing complexity of the process is in need.

SUMMARY OF THE INVENTION

It is therefore a primary objective of the claimed invention to provide a method for manufacturing a CMOS device having dual metal gate that is able to improve $V_{fb}$ roll-off issue.

According to the claimed invention, a method for manufacturing a CMOS device having dual metal gate is provided. The method comprises steps of providing a substrate having a first active region and a second active region defined thereon, respectively forming a first conductive type transistor and a second conductive type transistor in the first active region and the second active region, performing a salicide process, forming an inter-level dielectric (ILD) layer exposing tops of the first conductive type transistor and the second conductive type transistor on the substrate, performing a first etching process to remove a portion of a first gate of the first conductive type transistor to form an opening in the first active region, thus a high-K gate dielectric layer of the first conductive type transistor is exposed in a bottom of the opening, and forming at least a first metal layer in the opening.

According to the claimed invention, another method for manufacturing a CMOS device having dual metal gate is provided. The method comprises steps of providing a substrate having a first active region and a second active region defined thereon, respectively forming a first conductive type transistor and a second conductive type transistor in the first active region and the second active region, performing a salicide process, forming an ILD layer exposing tops of the first conductive type transistor and the second conductive type transistor on the substrate, performing a first etching process to remove a portion of a first gate of the first conductive type transistor to form a first opening in the first active region, thus a high-K gate dielectric layer of the first conductive type transistor is exposed in a bottom of the first opening, forming at least a first metal layer in the first opening, performing a second etching process to remove a portion of a second gate of the second conductive type transistor and to form a second opening in the second active region, thus a high-K gate dielectric layer of the second conductive type transistor is exposed in a bottom of the second opening, and forming at least a second metal layer in the second opening.

According to the method for manufacturing a CMOS device having dual metal gate, at least a conductive type transistor is formed by the gate last process, therefore the method is more applicable to form the conductive type transistor needed to avoid high heat budget. Thus $V_{fb}$ roll-off issue is improved and material choice for the metal gate is widened. In addition, since the high-K gate dielectric layer is not removed with the polysilicon layer and remaining in the opening, monitoring for thickness control and uniformity of such a thin layer can be omitted. Furthermore, because the high-K gate dielectric layer is not removed, the fine interface between the high-K gate dielectric layer and the substrate is prevented from adverse influence, thus carrier mobility in the channel region is also prevented from being affected.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
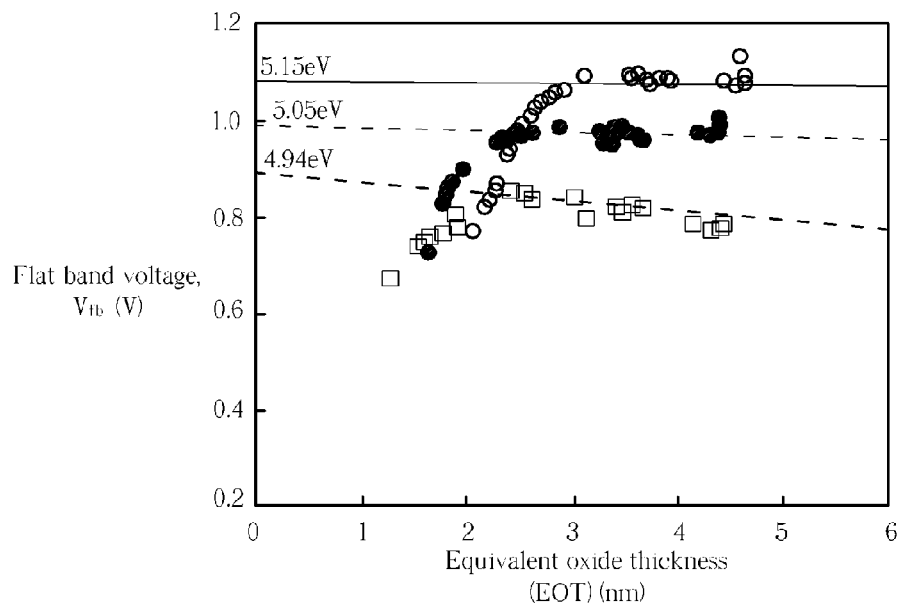
FIG. 1 is a diagram illustrating the relationship of EOT of the High-K gate dielectric layer of a PMOS device vs. flat band Voltage ($V_{fb}$).
Figure 2:
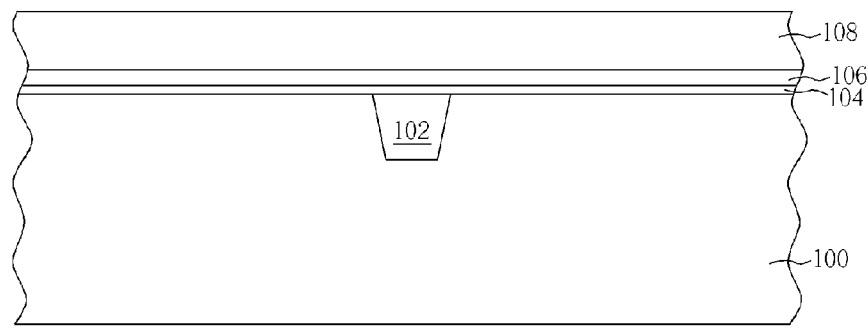
FIGS. 2-8 are schematic drawings illustrating a method for manufacturing a CMOS device having dual metal gate according to a first preferred embodiment of the present invention.

Please refer to FIGS. 2-8, which are schematic drawings illustrating a method for manufacturing a CMOS device having dual metal gate according to a first preferred embodiment of the present invention. As shown in FIG. 2, a substrate 100, such as a silicon substrate, a silicon-containing substrate, or a silicon-on-insulator (SOI) substrate, having a first active region 110 and a second active region 112 defined thereon is provided. The substrate 100 comprises a shallow trench isolation (STI) 102 used to provide electrical isolation between the first active region 110 and the second active region 112. Then, a high-K gate dielectric layer 104, a TaC layer 106, and a polysilicon layer 108 are sequentially formed on the substrate 100. Furthermore, a protective layer not shown) can be formed in between the high-K gate dielectric layer 104 and the TaC layer 106 for protecting the high-K gate dielectric layer 104 from damage during the following processes in the first preferred embodiment.

Figure 3:
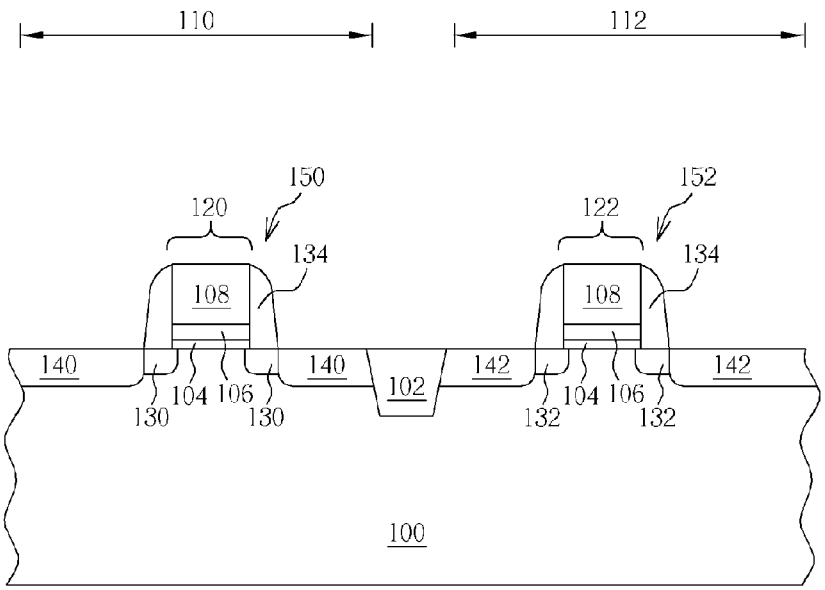

Please refer FIG. 3. Next, a photolithographic and etching process is performed to etch the polysilicon layer 108, the TaC layer 106, and the high-K gate dielectric layer 104 to form a first gate 120 and a second gate 122 respectively in the first active region 110 and the second active region 112. Please still refer to FIG. 3. Then, ion implantations with different conductive type ions are sequentially performed to form a first light doped drain (LDD) 130 in the substrate 100 at two sides of the first gate 120 and a second LDD 132 in the substrate 100 at two sides of the second gate 122. In addition, offset spacers can be formed on sidewalls of the first gate 120 and the second gate 122 before forming the first LDD 130 and the second LDD 132. Then, spacers 134 are formed on the sidewalls of the first gate 120 and the second gate 122, respectively. Following the formation of the spacers 134, ion implantations with different conductive type ions are sequentially performed to form a first source/drain 140 and a second source/drain 142 in the substrate 100 at two sides of the first gate 120 and the second gate 122, respectively. Thus, a first conductive type transistor 150 and a second conductive type transistor 152 are obtained respectively in the first active region 110 and the second active region 120.

Figure 4:
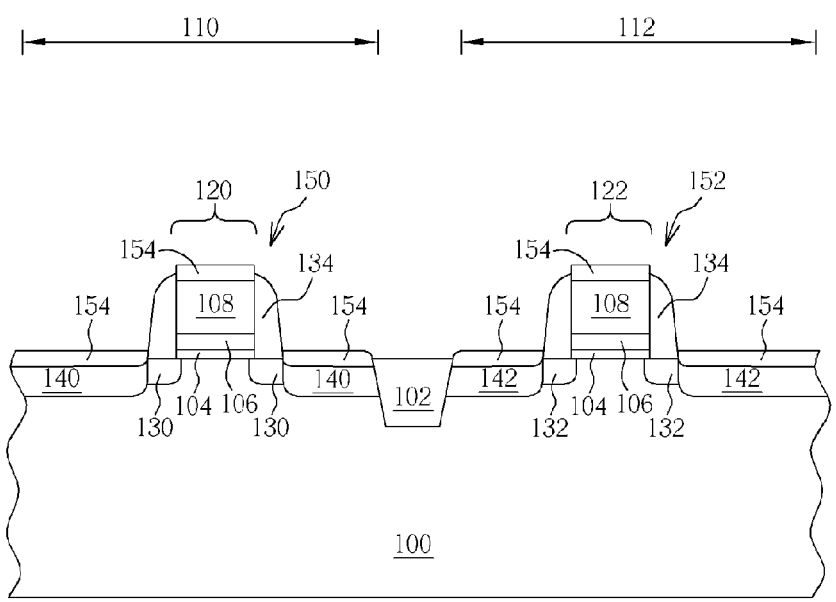
Figure 5:
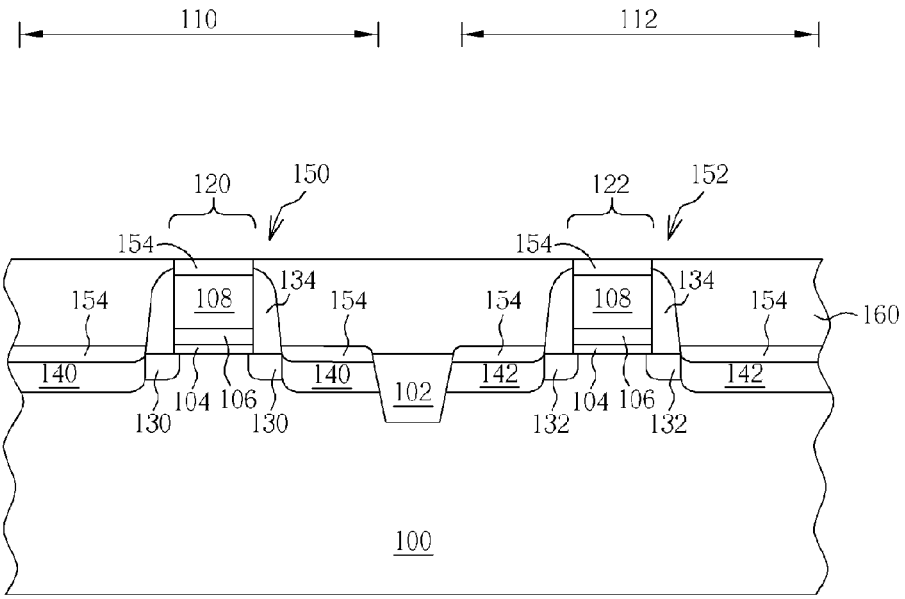

Please refer to FIG. 4. A self-aligned silicide (salicide) process is performed to form salicide layers 154 respectively in surfaces of the first gate 120, the second gate 122, the first source/drain 140, and the second source/drain 142. Please refer to FIG. 5. Then, an inter-level dielectric (ILD) layer 160 is formed on the substrate 100, followed by performing a chemical mechanical polishing (CMP) process used to planarize the ILD layer 160 and to expose the salicide layers 154 on tops of the first conductive type transistor 150 and the second conductive type transistor 152. Additionally, an etching back process can be performed after the CMP process that substantially planarizes the ILD layer 160 to further etch the ILD layer 160 and to expose the salicide layers 154 on the top of the first conductive type transistor 150. It is noticeable that the salicide layer 154 on the first conductive type transistor 150 can be entirely or partially removed with the two methodologies.

Figure 6:
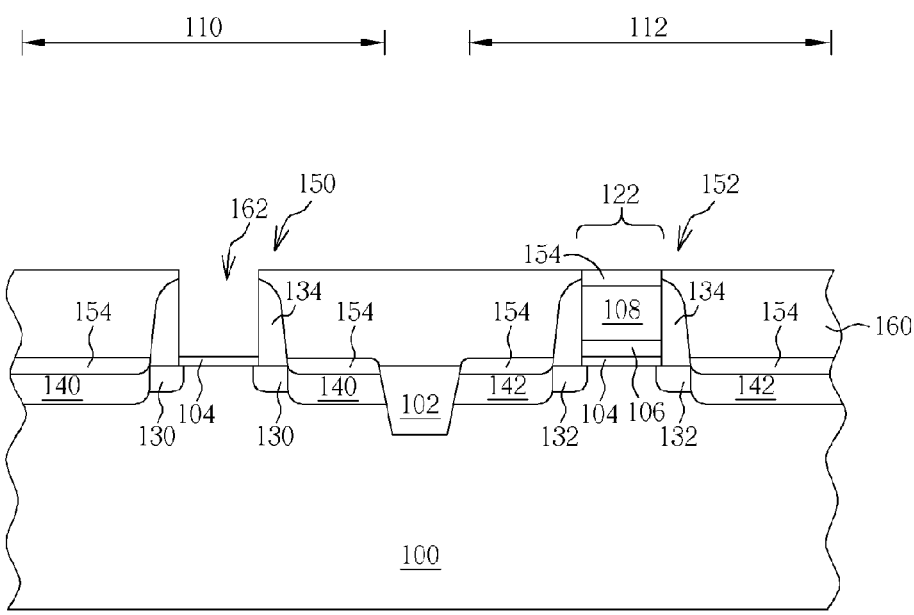

Please refer to FIG. 6. The salicide layer 154 on the top of the first gate 120 is then removed. A first etching process and a second etching process are sequentially performed to remove portions of the first gate 120 of the first conductive type transistor 150. For example, the first etching process is used to remove the polysilicon layer 108 of the first gate 120; and the second etching process is used to remove the TaC layer 106 of the first gate 120. Thus an opening 162 is formed in the first active region 150, as shown in FIG. 6. It is noteworthy that the high-K gate dielectric layer 104 of the first conductive type transistor 150 is exposed at a bottom of the opening 162. As mentioned above, a protectively layer can be formed on the high-K dielectric layer 104, thus a third etching process is needed to remove the protective layer. Alternatively, the third etching process is not performed to keep the protective layer remaining on the high-K dielectric layer 104. The formation of the protective layer can be applied not only to the first preferred embodiment, but also to be any modification of each preferred embodiment provided by the present invention.

Figure 7:
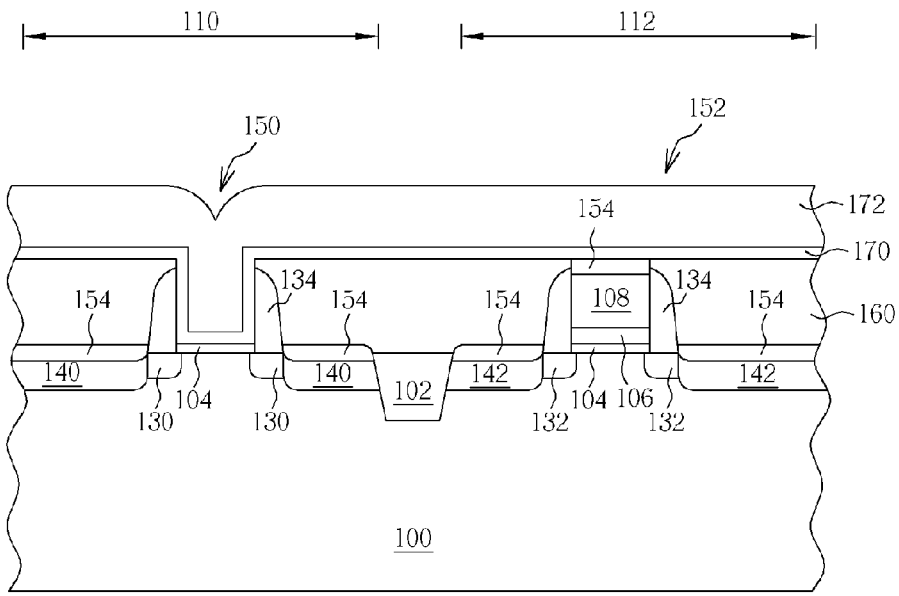

Please refer to FIG. 7. Then a metal layer 170 is formed in the opening 162. The metal layer 170 comprises metal materials such as MoAlN, W, MoN, TaCNO, TiN, or WN. It is observed that the gap-fill ability of the abovementioned metal material is inferior, therefore another metal layer 172 serving as the main material is provided to fill the opening 162 in order to avoid seam while the metal layer 170 is used to adjust work function in the first preferred embodiment. The metal layer 172 comprises metal materials such as Al, Ti, Ta, W, Nb, Mo, TiN, TiC, TaN, Ti/W, or Ti/TiN. Furthermore, to prevent the high-K gate dielectric layer 104 from diffusion or reacting with the metal layer 170, a barrier layer (not shown) can be formed before forming the metal layer 170. The barrier layer comprises refractory, noble, and lanthanide series elements such as Ti, Ta, Mo, Ru, and W and their aluminates and silicates and nitrogen or carbon incorporated, such as TiN, TaN, TaSiN, TaC, MoAlN, . . . etc.

Figure 8:
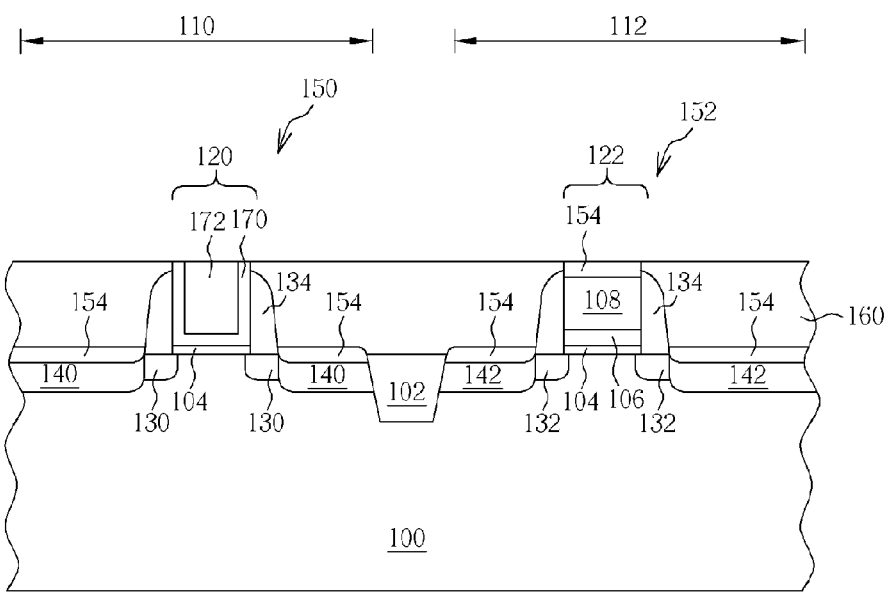

Please refer to FIG. 8. Then, a CMP process is performed to remove the unnecessary metal layers 170 and 172 to reform the first gate 120 of the conductive type transistor 150.

According to the first preferred embodiment of the present invention, the present method is benefited from the gate last process that is preferable when forming PMOS device, whose $V_{fb}$ roll-off issue is susceptible to high-temperature processes, and is able to provide a wider material choice. In addition, an interface layer (not shown) is conventionally to be formed before forming the high-K gate dielectric layer 104 for improving mobility of the carriers in the channel region. The interface layer can be a silicon oxide layer, a silicon oxynitride layer or a silicon nitride layer formed by combination reactions or by being heated to 850° C. Since this high-temperature process is performed before constructing the metal gate of the PMOS device according to the first preferred embodiment, the PMOS device is prevented from being affected. Furthermore, because the high-K gate dielectric layer 104 is not removed in the first preferred embodiment, re-formation of the high-K gate dielectric layer 104 in the opening 162 and consideration of monitoring thickness control and uniformity of such a thin layer can be omitted.

Figure 9:
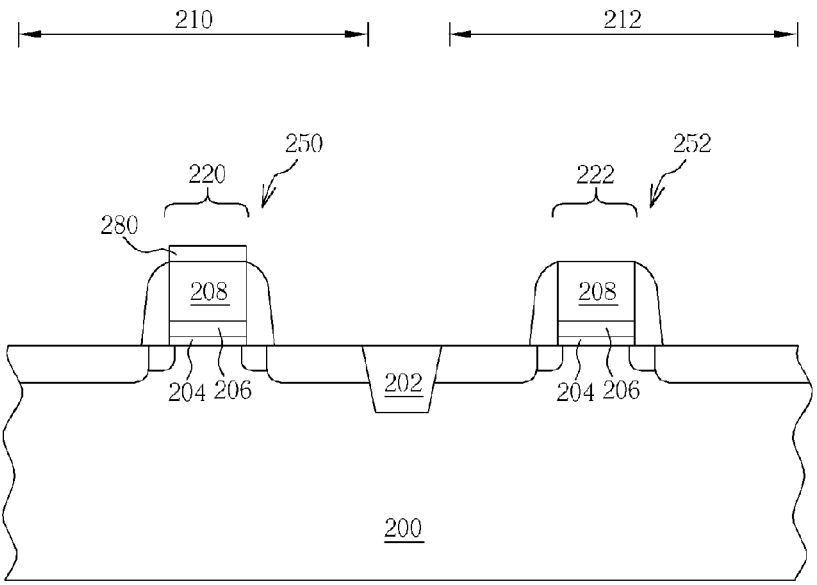
FIGS. 9-15 are schematic drawings illustrating a method for manufacturing a CMOS device having dual metal gate according to a second preferred embodiment of the present invention.
Figure 10:
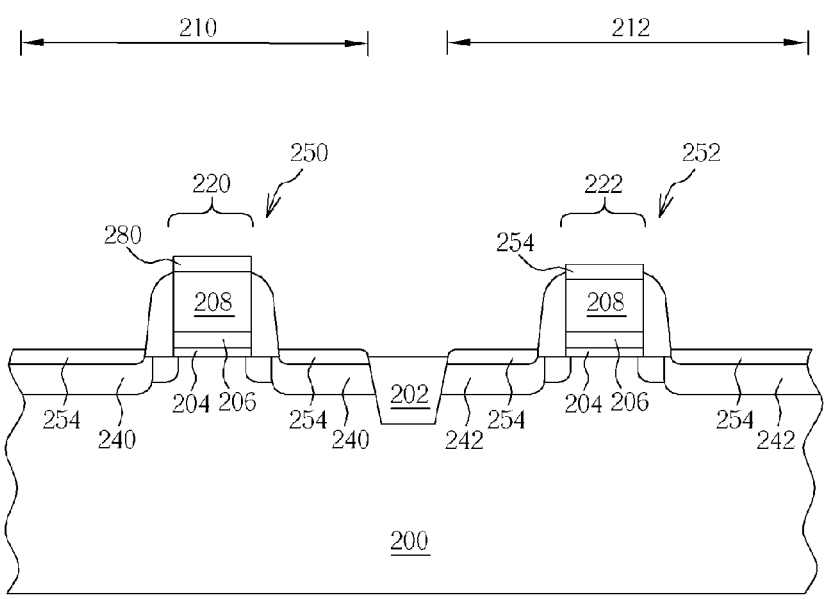

FIGS. 9-15 are schematic drawings illustrating a method for manufacturing a CMOS device having dual metal gate according to a second preferred embodiment of the present invention. As shown in FIG. 9, a substrate 200, such as silicon substrate, a silicon-containing substrate, or a SOI substrate is provided with a first active region 210 and a second active region 212 defined thereon. And a STI 202 used to provide electrical isolation between the first active region 210 and the second active region 212 is formed in the substrate 200. Then, a first conductive type transistor 250 and a second conductive type transistor 252 are respectively formed in the first active region 210 and the second active region 212. Because steps for forming the first conductive type transistor 250 and the second conductive type transistor 252 are similar with the first preferred embodiment, therefore the details are omitted herein in the interest of brevity. Next, a cap layer (not shown) is formed on the substrate 200. The cap layer can be a silicon oxide layer, a silicon nitride layer, or a silicon oxynitride layer. And a photographic and etching process is performed to remove a portion of the cap layer, thus a cap layer 280 remains on a first gate 220 of the first conductive type transistor 250, as shown in FIG. 10. Additionally, the cap layer 280 can be formed on the first gate 220 by oxidation, or by forming with a hard mask layer (not shown) serving for defining the gates followed by being etched simultaneously with formation of the gates and removing the unnecessary hard mask layer.

Figure 11:
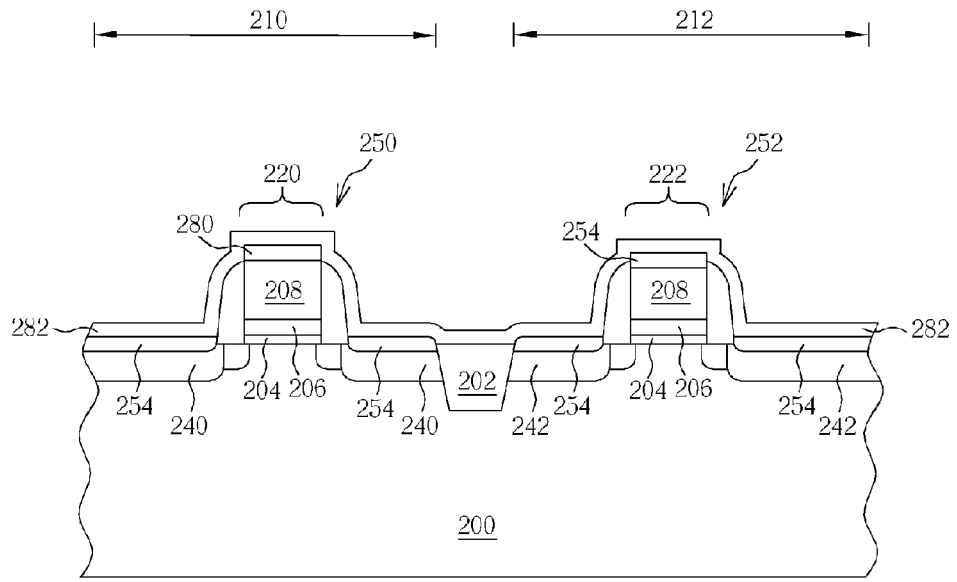

Please refer to FIGS. 10-11. Then, a salicide process is performed. Since the first gate 220 is covered by the cap layer 280, salicide layers 254 are to be formed only on surfaces of the polysilicon layer 208 of the second gate 222, the first source/drain 240, and the second source/drain 242. Additionally, a contact etch stop layer (CESL) 282 can be selectively formed on the substrate 200 serving as a selective strain scheme (SSS) by providing a stress generated by treating with heat or UV in the second preferred embodiment as shown in FIG. 11. It is noteworthy that since the whole procedure for forming the CMOS device is impervious to the selective strain scheme (SSS), the SSS can be applied not only to the second preferred embodiment, but also to any modification of each preferred embodiment provided by the present invention.

Figure 12:
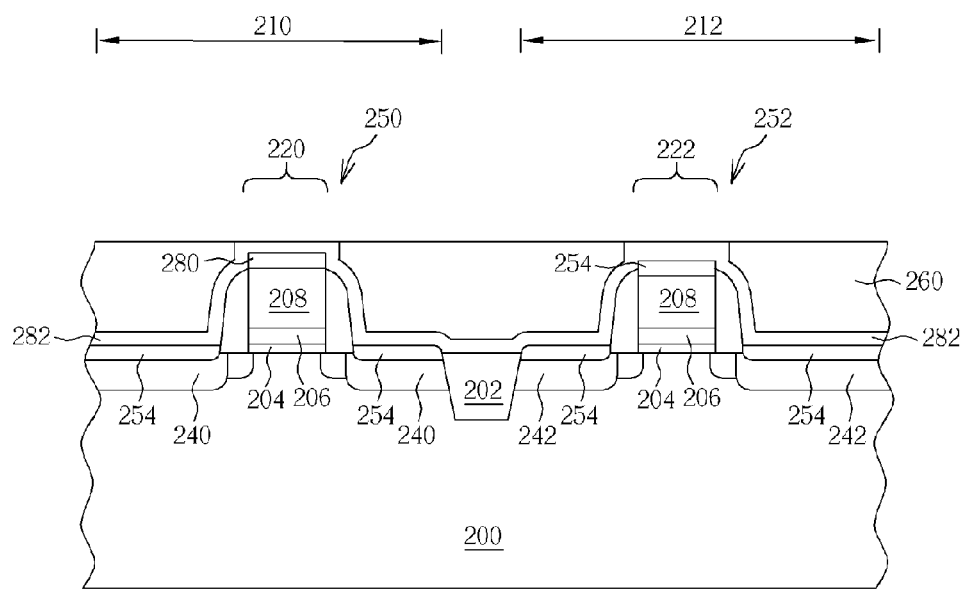

Please refer to FIG. 12. An ILD layer 260 is formed on the substrate 200, followed by performing a CMP process used to planarize the ILD layer 260. The CMP process is stopped at the CESL 282 as shown in FIG. 12. It is also practicable that an etching back process is performed after the CMP process that substantially planarizes the ILD layer 260 to further etch the ILD layer 260 and to expose the CESL 282. Additionally, the CMP process and the etching back process can be continued to expose the cap layer 280.

Figure 13:
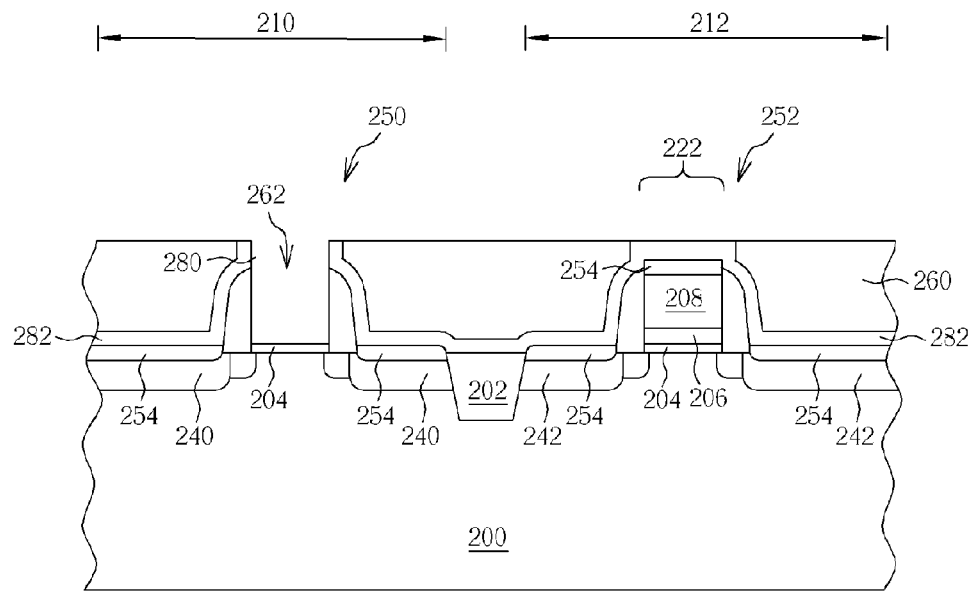

Please refer to FIG. 13. Then, different etching processes are performed to remove the CESL 282 and the cap layer 280 on the first gate 220, followed by a first etching process and a second etching process used to remove portions of the first gate 220, respectively. For instance, the first etching process is used to remove the polysilicon layer 208 of the first gate 220 and the second etching process is used to remove the TaC layer 206. Thus an opening 262 is formed in the first active region as shown in FIG. 13. It is noteworthy that a high-K gate dielectric layer 204 of the first conductive type transistor 250 is exposed at a bottom of the opening 262. As mentioned above, a protective layer can be selectively formed on the high-K gate dielectric layer 204, thus a third etching process is needed to remove the protective layer. On the contrary, the protective layer can be remained on the high-K gate dielectric layer 204 without performing the third etching process.

Figure 14:
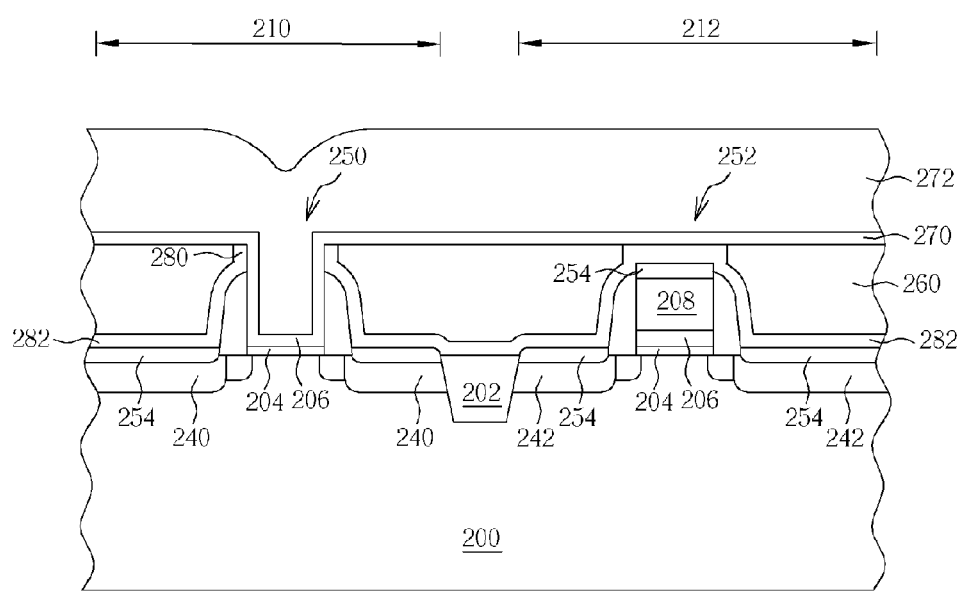
Figure 15:
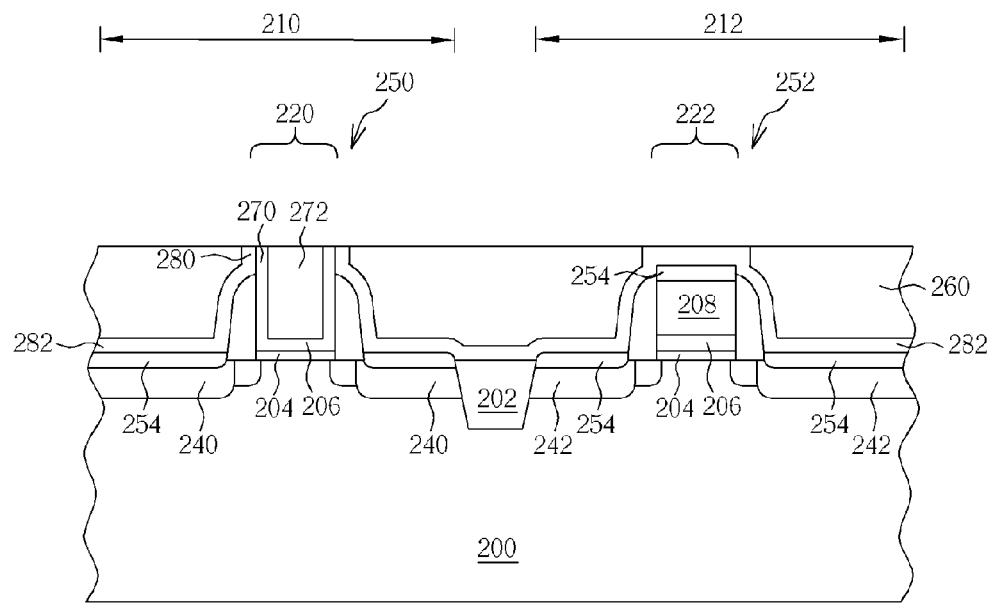
Figure 16:
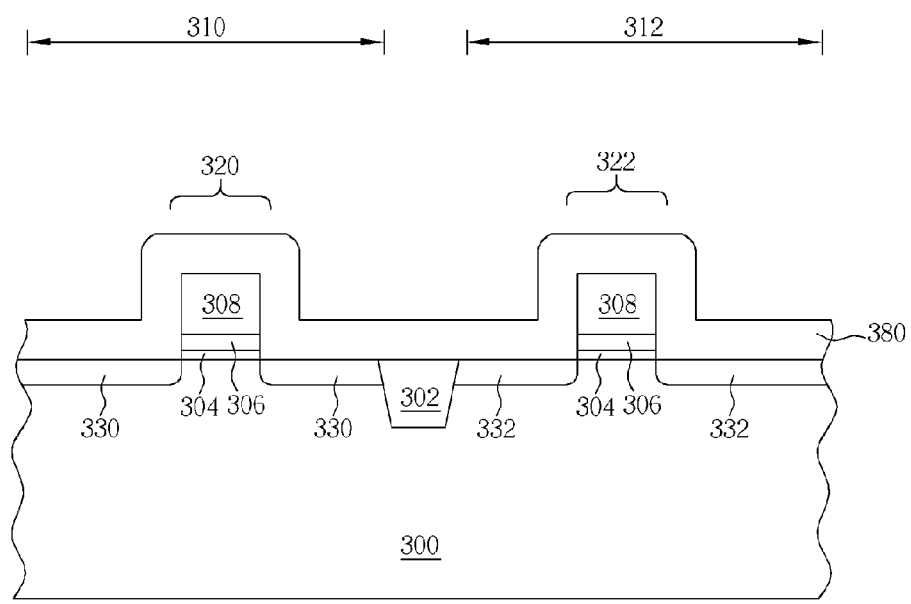
FIGS. 16-21 are schematic drawings illustrating a method for manufacturing a CMOS device having dual metal gate according to a third preferred embodiment of the present invention.

Please refer to FIG. 14. Then, a metal layer 270 comprising metal materials as mentioned in the first preferred embodiment is formed in the opening 262. Since the gap-fill ability of those metal materials is inferior, another metal layer 272 serving as the main material is provided to fill the opening 262 in order to avoid seam while the metal layer 270 is used to adjust work function in the second preferred embodiment. The metal layer 272 comprises materials as mentioned in the first embodiment. Please refer to FIG. 15. Next, a CMP process is performed to remove the unnecessary metal layers 270 and 272 to reform the first gate 220 of the first conductive type transistor 250.

It is well-known that the salicide is not easily removed, and gate and profile of the peripheral ILD layer may be adversely affected while removing the salicide, therefore the cap layer 280 covering the first gate 220 is rendered by the second preferred embodiment in order to avoid the salicide layer 254 from forming on the first gate 220. Thus the problem caused by removing the salicides on the first gate 220 is eliminated.

Figure 17:
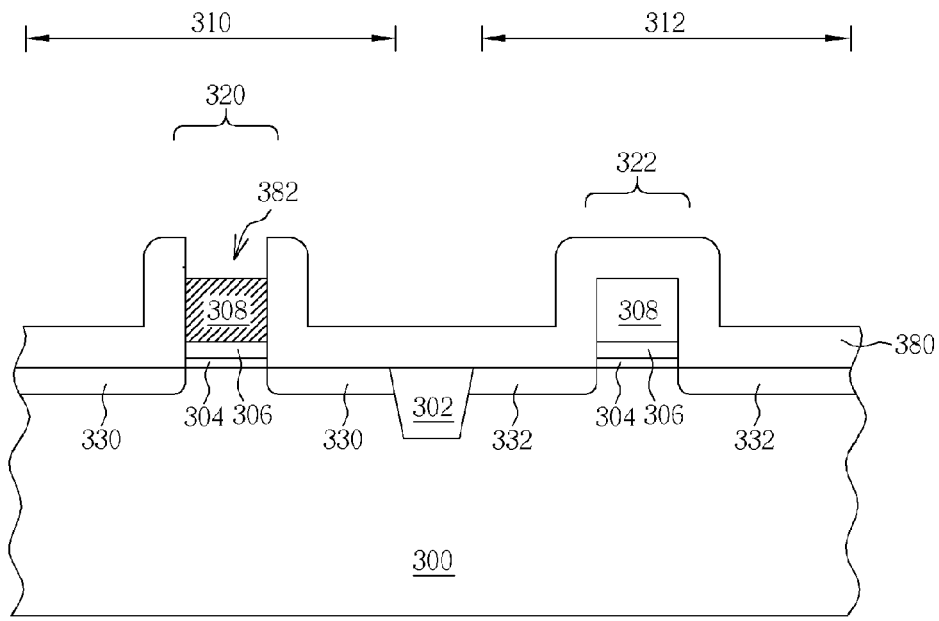
Figure 18:
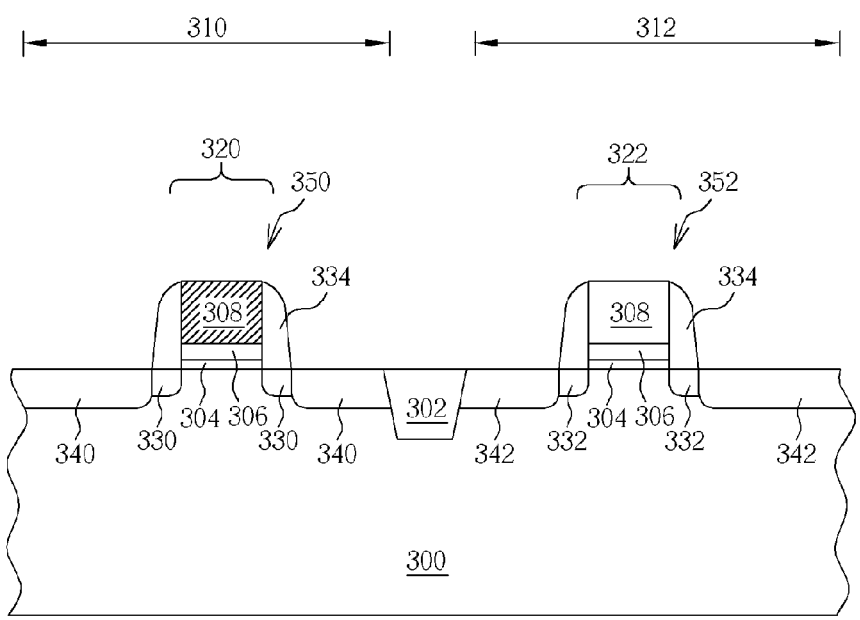

Please refer to FIGS. 16-21, which are schematic drawings illustrating a method for manufacturing a CMOS device having dual metal gate according to a third preferred embodiment of the present invention. As shown in FIG. 18, a substrate 300, such as a silicon substrate, a silicon-containing substrate, or a SOI substrate, is provided with a first active region 310 and a second active region 312 defined thereon. The substrate 300 further comprises a STI 302 used to provide electrical isolation between the first active region 310 and the second active region 312. Next, a high-K gate dielectric layer 304, a TaC layer 306, and a polysilicon layer 308 are sequentially formed on the substrate 300. As mentioned above, a protective layer can be formed in between the high-K gate dielectric layer 304 and the TaC layer 306 for protecting the high-K gate dielectric layer 304 from damage in the following processes. Then, a photolithographic and etching process is performed to etch the polysilicon layer 308, the TaC layer 306, and the high-K gate dielectric layer 304 to form a first gate 320 and a second gate 322 respectively in the first active region 310 and the second active region 312. Please still refer to FIG. 16. Then a liner (not shown) is formed on the substrate 300. The liner can be a silicon oxide layer. Next, ion implantations with different conductive type ions are sequentially performed to form a first LDD 330 in the substrate 300 respectively at two sides of the first gate 320 and a second LDD 332 in the substrate 300 respectively at two sides of the second gate 322. After forming the first LDD 330 and the second LDD 332, a silicon nitride layer 380 is formed on the substrate 300.

Please refer to FIG. 17. Then, another photolithographic and etching process is performed to remove the silicon nitride layer 380 and the liner on the first gate 320, thus an opening 382 exposing the polysilicon layer 308 of the first gate 320 is formed in the first active region 310. Following the formation of the opening 382, a polysilicon oxidation process such as a rapid thermal oxidation (RTO) or oxygen plasma bombardment is performed to oxidize the entire or a portion of the polysilicon layer 308 of the first gate 320 through the opening 382.

Please refer to FIG. 18. Next, an etching back process is performed to remove a portion of the silicon nitride layer 380, thus spacers 334 are formed respectively on sidewalls of the first gate 320 and the second gate 322. Then, ion implantations with different conductive type ions are sequentially performed to form a first source/drain 340 and a second source/drain 342 in the substrate 300 at two sides of the first gate 320 and the second gate 322, respectively. Thus a first conductive type transistor 350 and a second conductive type transistor 352 are respectively formed in the first active region 310 and the second active region 320.

Figure 19:
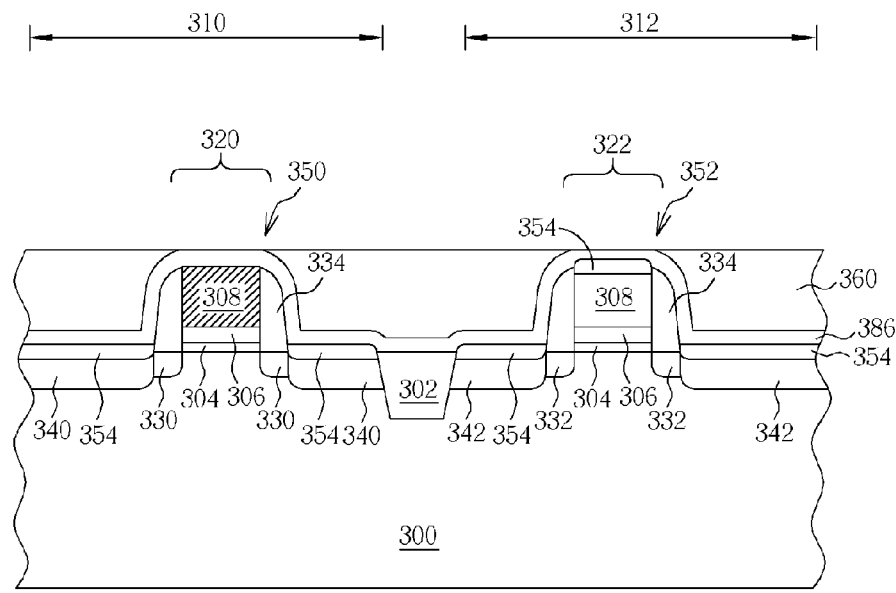

Please refer to FIG. 19. Then, a salicide process is performed. Since the polysilicon layer 308 of the first gate 320 has been oxidized, salicide layers 354 are to be formed only on the polysilicon layer 308 of the second gate 322 and on surfaces of the first source/drain 340 and the second source/drain 342. As mentioned above, a CESL 386 serving as selective strain scheme (SSS) by providing stress generated from heat or UV can be selectively formed on the substrate 300. Since the whole procedure for forming the CMOS device is impervious to the SSS, the SSS is not limited to be applied to the third preferred embodiment either.

Please refer to FIG. 19 again. An ILD layer 360 is formed on the substrate 300, followed by a CMP process used to planarize the ILD 360. The CMP process is stopped at the CESL 386. It is also practicable that an etching back process is performed after the CMP process to further etch the ILD layer 360 and to expose the CESL 386.

Figure 20:
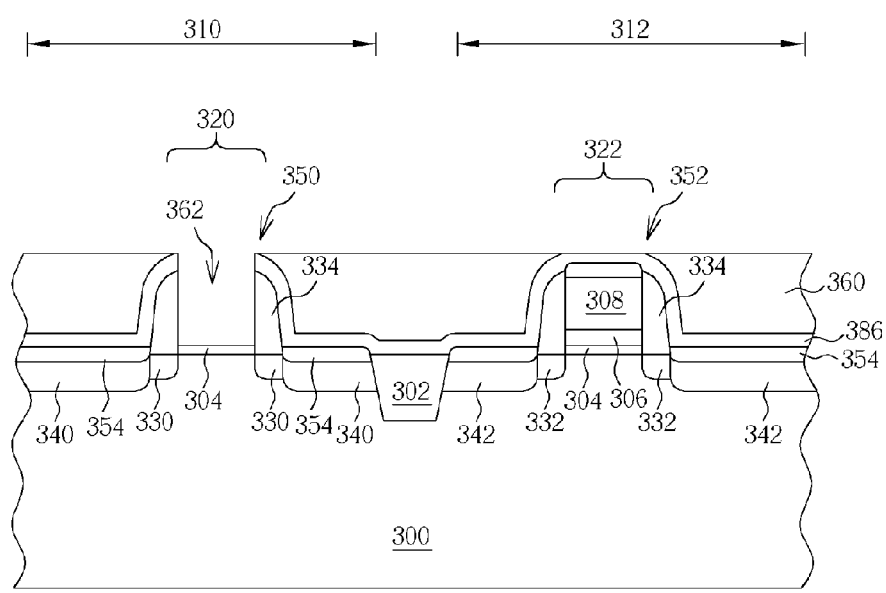

Please refer to FIG. 20. Then, an etching process is performed to remove the CESL 386 on the first gate 320. And a first etching process and a second etching process are sequentially performed to remove portions of the first gate 320 of the first conductive type transistor 350 after the CESL 386 on the first gate 320 is removed. For instance, the first etching process is used to remove the oxidized polysilicon layer 308 of the first gate 320; and the second etching process is used to remove the TaC layer 306. Thus an opening 362 is formed in the first active region 310 as shown in FIG. 20. It is noteworthy that the high-K gate dielectric layer 304 of the first gate 320 is exposed at the bottom of the opening 362. As mentioned above, a protective layer can be selectively formed on the high-K gate dielectric layer 304, thus a third etching process is needed to remove the protective layer. On the contrary, the protective layer can be remained on the high-K gate dielectric layer 304 without performing the third etching process.

Figure 21:
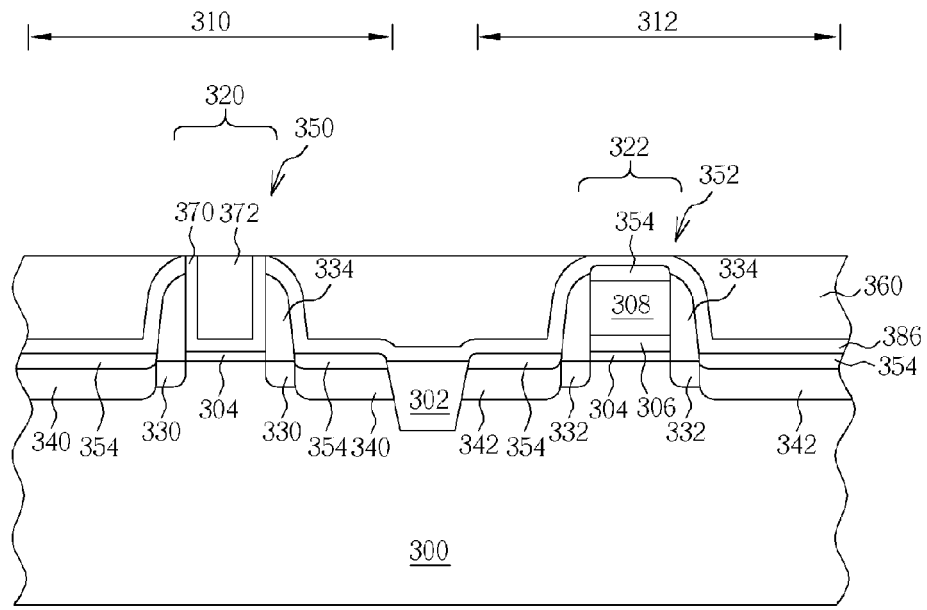

Please refer to FIG. 21. Next, a metal layer 370 serving to adjust work function and a metal layer 372 serving to be the main gap-filling material are sequentially formed in the opening 362, followed by a CMP process used to remove the unnecessary metal layers 370 and 372. Therefore the first gate 320 of the first conductive type transistor 350 is reformed. Because steps and materials used to form the metal layers 370 and 372 are similar to those described in the first and second preferred embodiments, the details are omitted in the third preferred embodiment in the interest of brevity.

As mentioned above, it is well-known that the salicide is not easily removed, and gate and profile of the peripheral ILD layer may be adversely affected while removing the salicide, therefore the polysilicon oxidation is applied to oxidize the polysilicon layer 308 of the first gate 320 and the salicide layer 354 is prevented from forming the first gate 320 in the third preferred embodiment. Thus the problem caused by removing the salicides on the first gate 320 is eliminated.

Figure 22:
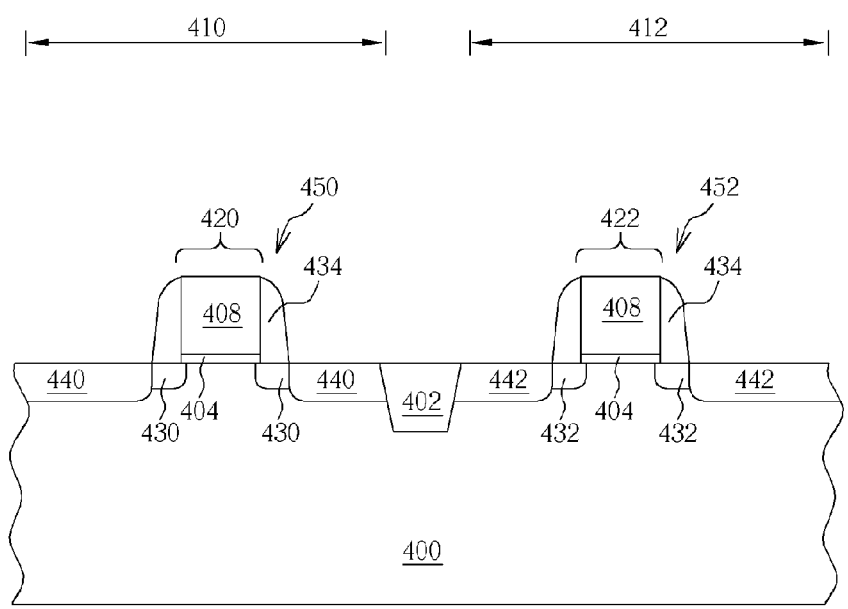
FIGS. 22-26 are schematic drawings illustrating a method for manufacturing a CMOS device having dual metal gate according to a fourth preferred embodiment of the present invention.

Please refer to FIGS. 22-26, which are schematic drawings illustrating a method for manufacturing a CMOS device having dual metal gate according to a fourth preferred embodiment of the present invention. As shown in FIG. 22, a substrate 400 such as a silicon substrate, a silicon-containing substrate, or a SOI substrate is provided with a first active region 410 and a second active region 412 defined thereon. The substrate 400 further comprises a STI 402 used to provide electrical isolation between the first active region 410 and the second active region 412. Then, a high-K gate dielectric layer 404 and a polysilicon layer 408 are sequentially formed on the substrate 400. In the fourth preferred embodiment, a protective layer can be selectively formed in between the high-K gate dielectric layer 404 and the polysilicon layer 408 for protecting the high-K gate dielectric layer 404 from damage in the following processes. Then, a photolithographic and etching process is performed to remove a portion of the polysilicon layer 408 and the high-K gate dielectric layer 404, thus a first gate 420 and a second gate 422 are respectively formed in the first active region 410 and the second active region 412. Next, a first LDD 430 is formed in the substrate 400 at two sides of the first gate 420 and a second LDD 432 is formed in the substrate 400 at two sides of the second gate 422. Spacers 434 are then formed on sidewalls of the first gate 420 and the second gate 422. And a first source/drain 440 is formed in the substrate 400 at the two sides of the first gate 420 and a second source/drain 442 is formed in the substrate 400 at the two sides of the second gate 422. Thus a first conductive type transistor 450 and a second conductive type transistor 452 are obtained as shown in FIG. 22.

Figure 23:
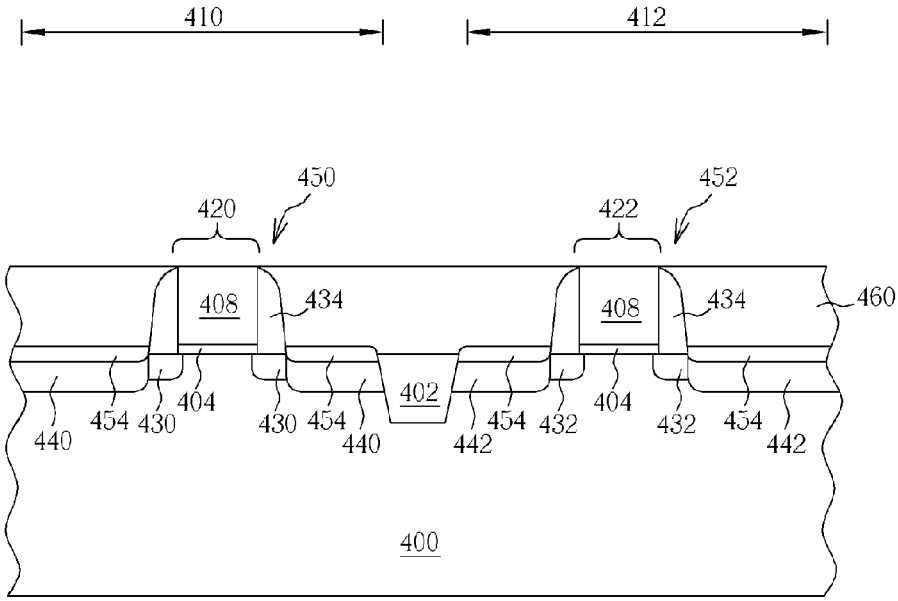

Please refer to FIG. 23. A salicide process is performed with a hard mask layer or a cap layer (not shown) covering the polysilicon layers 408 of the first gate 420 and the second gate 422, therefore salicide layers 454 are formed only on surfaces of the first source/drain 440 and the second source/drain 442, respectively. Please still refer to FIG. 23. Then a step of forming an ILD layer 460 on the substrate 400, followed by a CMP process used to planarize the ILD layer 460 and expose tops of the first gate 420 and the second gate 422 are performed.

Figure 24:
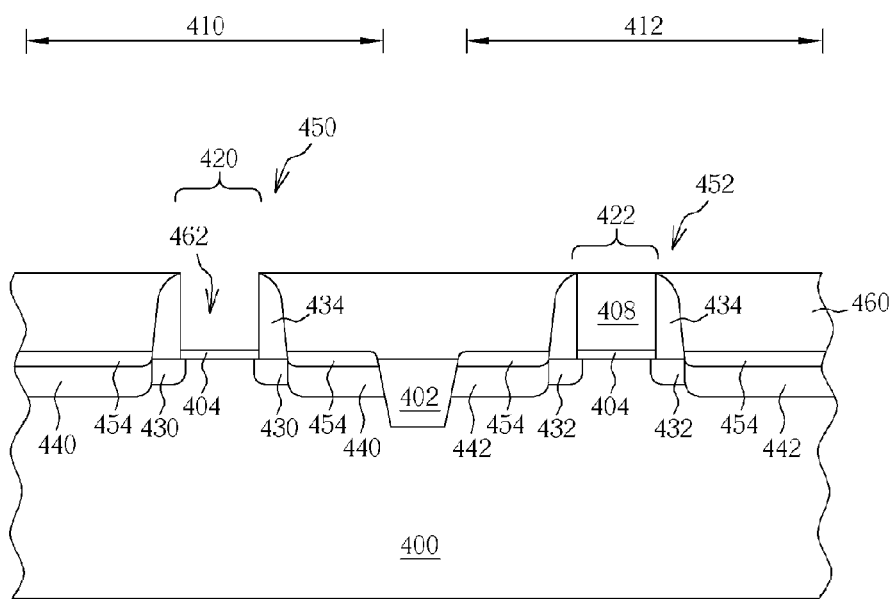

Please refer to FIG. 24. A first etching process is performed to remove the polysilicon layer 408 of the first gate 420 and to form an opening 462 in the first active region 450. It is noteworthy that the high-K gate dielectric layer 404 of the first gate 420 is exposed at the bottom of the opening 462. As mentioned above, a protective layer can be selectively formed on the high-K gate dielectric layer 404, thus a third etching process is needed to remove the protective layer. On the contrary, the protective layer can be remained on the high-K gate dielectric layer 404 without performing the third etching process.

Figure 25:
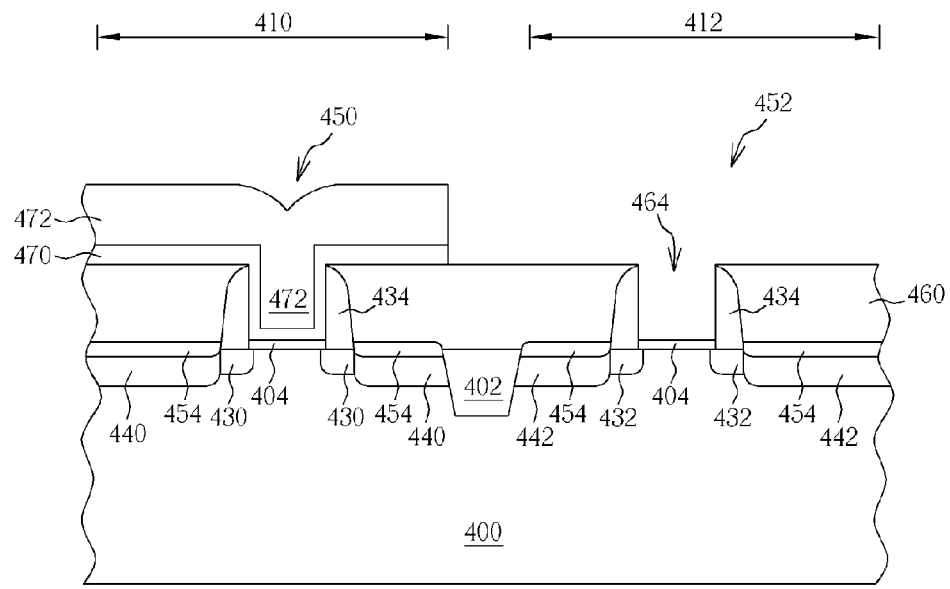

Please refer to FIG. 25. Then, a metal layer 470 comprising MoAlN, W, MoN, TaCNO, TiN, or WN is formed in the opening 462. Because gap-fill ability of the above mentioned metal is inferior, a metal layer 472 comprising Al, Ti, Ta, W, Nb, Mo, TiN, TiC, TaN, Ti/W, or Ti/TiN is used to be the main gap-filling material and formed in the opening 462 to avoid seam. Additionally, to prevent the high-K gate dielectric layer 404 from diffusion or reacting with the metal layer 470, a barrier layer (not shown) can be formed before forming the metal layer 470. The barrier layer comprises refractory, noble, and lanthanide series elements such as Ti, Ta, Mo, Ru, and W and their aluminates and silicates and nitrogen or carbon incorporated, such as TiN, TaN, TaSiN, TaC, MoAlN, . . . etc.

Please still refer to FIG. 25. Then, a second etching process is performed to remove the polysilicon layer 408 of the second gate 422 and to form an opening 464 in the second active region 412. It is noteworthy that the high-K gate dielectric layer 404 of the second gate 422 is exposed at the bottom of the opening 464. As mentioned above, a protective layer can be selectively formed on the high-K gate dielectric layer 404, thus a third etching process is needed to remove the protective layer. On the contrary, the protective layer can be remained on the high-K gate dielectric layer 404 without performing the third etching process.

Figure 26:
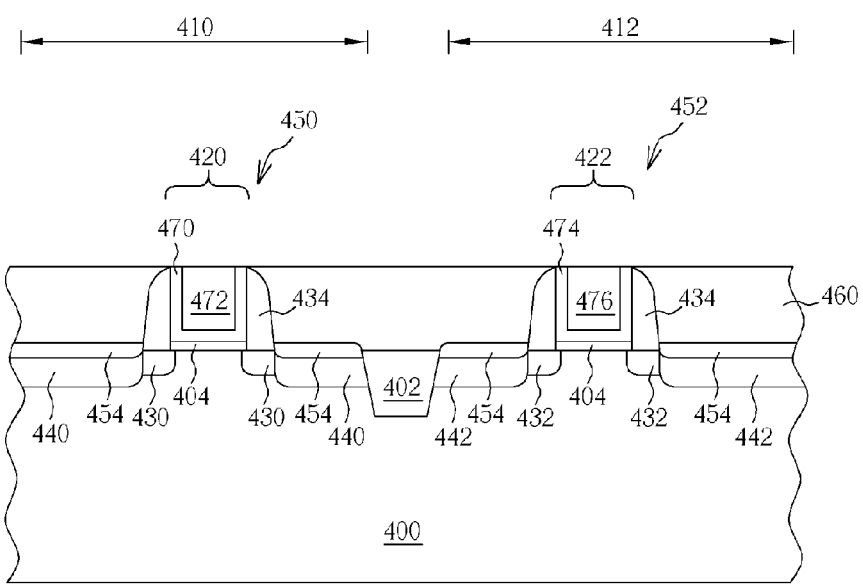

Please refer to FIG. 26, a metal layer 474 comprising material such as TaC or TiAlN is then formed in the opening 464. Since gap-fill ability of the metal layer 474 is inferior, a metal layer 476 comprising Al, Ti, Ta, W, Nb, Mo, TiN, TiC, TaN, Ti/W, or Ti/TiN is used to be the main gap-filling material and formed in the opening 464 to avoid seam. And a barrier layer (not shown) as mentioned above can be formed in between the high-K gate dielectric layer 404 and the metal layer 474. Finally, a CMP process or other etching process is performed to remove the unnecessary metal layers 470, 472, 474, and 476. Thus the first gate 420 and the second gate 422 are reformed.

According to the method for manufacturing a CMOS device having dual metal gate, at least a conductive type transistor is formed by the gate last process, therefore the method is more applicable to form the conductive type transistor needed to avoid high heat budget. Thus $V_{fb}$ roll-off issue is improved and material choice for the metal gate is widened. In addition, since the high-K gate dielectric layer is not removed with the polysilicon layer and remaining in the opening, monitoring for thickness control and uniformity of such a thin layer can be omitted. Also, because the high-K gate dielectric layer is not removed, the fine interface between the high-K gate dielectric layer and the substrate is prevented from being affected, thus carrier mobility in the channel region is prevented from adverse influence. Furthermore, selective strain scheme (SSS) provided by CESL can be applied in the present invention to further improve performance of the MOS device.

Those skilled in the art will readily observe that numerous modifications and alterations of the device and method may be made while retaining the teachings of the invention.

What is claimed is:

1. A method for manufacturing a complementary metal oxide semiconductor (CMOS) device having dual metal gate comprising steps of:
   providing a substrate having a first active region and a second active region defined thereon;
   forming a first conductive type transistor having a first gate and a second conductive type transistor having a second gate respectively in the first active region and the second active region;
   performing a salicide process to transform a top part of the second gate into a salicide layer while leave a bottom part of the second gate without change;
   forming an inter-level dielectric (ILD) layer exposing tops of the first conductive type transistor and the second conductive type transistor on the substrate after the salicide process;
   performing a first etching process to remove a portion of the first gate of the first conductive type transistor to form an opening in the first active region, and a high-K gate dielectric layer of the first conductive type transistor being exposed in a bottom of the opening; and
   forming at least a first metal layer in the opening.

2. The method of claim 1, wherein the step of forming the first conductive type transistor and the second conductive type transistor further comprises:
   forming the high-K gate dielectric layer, a TaC layer, and a polysilicon layer on the substrate sequentially;
   performing a photolithographic and etching process to etch the polysilicon layer, the TaC layer, and the high-K gate dielectric layer to form the first gate and the second gate respectively in the first active region and the second active region;
   forming a first light doped drain (LDD) and a second LDD in the substrate at two sides of the first gate and the second gate, respectively;
   forming a spacer on sidewalls of the first gate and the second gate, respectively; and
   forming a first source/drain and a second source/drain in the substrate at two sides of the first gate and the second gate, respectively.

3. The method of claim 2 further comprising a step of performing a second etching process after the first etching process, the first etching process is used to remove the polysilicon layer of the first conductive type transistor and the second etching process is used to remove the TaC layer of the first conductive type transistor.

4. The method of claim 2 further comprising a step of forming a protective layer covering the high-K gate dielectric layer in the first active region.

5. The method of claim 4 further comprising a step of performing a third etching process after the first etching process to remove the protective layer and expose the high-K gate dielectric layer.

6. The method of claim 2 further comprising a step of performing a polysilicon oxidation process after forming the first LDD and the second LDD to oxidize the entire or a portion of the polysilicon layer.

7. The method of claim 2 further comprising a step of forming a cap layer on the first gate.

8. The method of claim 7 further comprising a step of performing a fourth etching process before the first etching process to remove the cap layer.

9. The method of claim 2 further comprising a step of forming a contact etch stop layer (CESL) on the substrate before forming the ILD.

10. The method of claim 9 further comprising a step of performing a fifth etching process before the first etching process to remove the CESL on the first gate.

11. The method claim 1, wherein the metal layer comprises MoAlN, W, MoN, TaCNO, TiN, or WN.

12. The method of claim 1 further comprising a step of forming a second metal layer in the opening after forming the first metal layer, and the second metal layer comprises Al, Ti, Ta, W, Nb, Mo, TiN, TiC, TaN, Ti/W, or Ti/TiN.

* * * * *